(12) United States Patent
Yamazaki

(10) Patent No.: US 6,472,873 B2
(45) Date of Patent: Oct. 29, 2002

(54) METHOD AND APPARATUS FOR CAPTURING MAGNETIC RESONANCE SIGNALS, RECORDING MEDIUM AND SYSTEM FOR MAGNETIC RESONANCE IMAGING USING THE SAME

(75) Inventor: Aki Yamazaki, Tokyo (JP)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/911,961

(22) Filed: Jul. 24, 2001

(65) Prior Publication Data

US 2002/0053906 A1 May 9, 2002

(30) Foreign Application Priority Data

Sep. 29, 2000 (JP) ........................................ 2000-299274

(51) Int. Cl.$^7$ .................................................. G01V 3/00
(52) U.S. Cl. ........................ 324/309; 324/318; 324/307
(58) Field of Search ................................. 324/309, 307, 324/306, 311, 312, 300, 318

(56) References Cited

U.S. PATENT DOCUMENTS

| 5,545,995 A | * | 8/1996 | Schneider et al. ........... 324/318 |
| 5,631,560 A | * | 5/1997 | Machida ...................... 324/309 |
| 6,037,771 A | * | 3/2000 | Liu et al. ..................... 324/309 |

FOREIGN PATENT DOCUMENTS

| EP | 1 193 508 A2 | * | 9/2001 | ......... G01R/33/565 |

* cited by examiner

Primary Examiner—Edward Lefkowitz
Assistant Examiner—Brij B. Shrivastav
(74) Attorney, Agent, or Firm—Moonray Kojima

(57) ABSTRACT

The present invention provides selective excitation of a slab by RF signals of frequency compensated for in response to the error in the gradient magnetic field in the slice axis direction and phase encoding in the slice axis direction with the phase compensated for corresponding to the corrected frequency, in order to capture appropriate magnetic resonance signals in three dimensional scanning when there is an error in the slice gradient.

19 Claims, 6 Drawing Sheets

Profile of a slab

Profile of spin phase

METHOD AND APPARATUS FOR CAPTURING MAGNETIC RESONANCE SIGNALS, RECORDING MEDIUM AND SYSTEM FOR MAGNETIC RESONANCE IMAGING USING THE SAME

BACKGROUND OF THE INVENTION

The present invention relates to a method and apparatus for capturing magnetic resonance signals, recording medium and apparatus for magnetic resonance imaging using the same and more particularly to a method and apparatus for capturing magnetic resonance signal by using three-dimensional scanning, a recording medium for storing a program to execute such magnetic resonance imaging signal capturing method on a computer, as well as a magnetic resonance imaging apparatus having a means for capturing magnetic resonance imaging signals.

In MRI (magnetic resonance imaging) systems, the imaging principle consists of carrying a subject to be imaged into a bore in a ring magnet system of the magnetic resonance imaging apparatus, which is a space static magnetic field formed, applying a gradient magnetic field and a high frequency magnetic field thereto so as to generate spins to emit magnetic resonance signals, and reconstructing an image based on the signals received from the spins.

The gradient magnetic field will be applied in three axial directions each perpendicular to others. Three axes each perpendicular to others are a slice axis, phase axis, and frequency axis. The gradient magnetic field in the slice axis is a magnetic field, which enables the selective excitation of a desired slice on the slice axis by means of radio frequency (RF) excitation signals, and may also be called as a slice gradient. The gradient magnetic field in the phase axis is a magnetic field which enables a phase encoding of spins, and may also be called a chase encoding gradient. The gradient magnetic field in the frequency axis is a magnetic field, which enables reading out of magnetic resonance signals, which magnetic field may also be called as a read out gradient.

In a three-dimensional scanning, a slab, which is a slice of larger thickness, will be selectively excited so as to phase encode thereon in both phase axis and slice axis.

An error in the slice gradient may cause an erroneous position of the slab selectively excited. In such a case, the RF exciting frequency is to be modified so as to selectively excite a slice in a correct position. However, the reconstructed image may contain folding in the direction of slice axis.

SUMMARY OF THE INVENTION

It is therefore an object of the present invention to provide a method and apparatus for capturing magnetic resonance signals suitable for three dimensional scanning when there is an error in the slice gradient, a recording medium for storing a program to execute on a computer a function for capturing magnetic resonance signals, as well as a magnetic resonance imaging system incorporating a means for capturing magnetic resonance imaging signals.

To achieve the objects and in accordance with the purpose of the invention, as embodied and broadly described herein, the present invention in one aspect provides:

(1) a method for capturing magnetic resonance signals, using a three dimensional scanning to selectively excite a slab with a gradient magnetic field and RF signals applied in the slice axis and to phase encode in a slice axis direction, characterized by comprising the steps of:
selectively exciting a slab by means of RF signals having a frequency compensated for in response to the error of the gradient magnetic field in the slice axis; and
phase encoding in the slice axis in the compensated phase corresponding to the compensation for the frequency.

The present invention in another aspect provides (2) an apparatus for capturing magnetic resonance signals, using a three dimensional scanning by means of a static magnetic field, gradient magnetic field and high frequency magnetic field to selectively excite a slab with a gradient magnetic field and RF signals applied in the slice axis and to phase encode in a slice axis direction, characterized by comprising:
a selectively exciting means for selectively exciting a slab by means of RF signals having a frequency compensated for in response to the error of the gradient magnetic field In he slice axis; and
a phase encoding means for phase encoding in the slice axis * n the compensated phase corresponding to the compensation for the frequency.

The present invention in still another aspect provides (3) a computer-readable recording medium for storing a program to be executed on a computer, using a three dimensional scanning by means of a static magnetic field, gradient magnetic field and high frequency magnetic field to selectively excite a slab with a gradient magnetic field and RF signals applied in the slice axis and to phase encode in a slice axis direction, said program characterized by comprising the steps of:
selectively exciting a slab by means of RF signals having a frequency compensated for in response to the error of the gradient magnetic field in the slice axis; and
phase encoding in the slice axis in the compensated phase corresponding to the compensation for the frequency.

The present invention in yet another aspect provides (4) a magnetic resonance imaging system, for capturing magnetic resonance imaging signals by using a three dimensional scanning by means of a static magnetic field, gradient magnetic field and high frequency magnetic field to selectively excite a slab with a gradient magnetic field and RF signals applied in the slice axis and to phase encode in a slice axis direction, in order to reconstruct an image based on thus captured signals, the system for capturing magnetic resonance imaging signals characterized by comprising:
a selectively exciting means for selectively exciting a slab by means of RF signals having a frequency compensated for in response to the error of the gradient magnetic field in the slice axis; and
a phase encoding means for chase encoding in the slice axis in the compensated phase corresponding to the compensation for the frequency.

In the above aspects of the present invention, proper magnetic resonance signals may be captured in he three dimensional scanning when there is an error in the slice gradient, since a slab is selectively excited by RF signals having a frequency compensated for in response to the error in the gradient magnetic field in the slice axis and phase encoded in the slice axis direction.

In accordance with the present invention, a method and apparatus for appropriately capturing magnetic resonance signals in three dimensional scanning when there is an error in the slice gradient, a recording medium that stores a program for executing on a computer the functionality of capturing the magnetic resonance signals, as well as a system for magnetic resonance imaging incorporating means for capturing magnetic resonance signals can be achieved.

Further objects and advantages of the present invention will be apparent from the followings description of the preferred embodiments of the invention as illustrated in the accompanying drawings.

DETAILED DESCRIPTION OF THE INVENTION

A detailed description of one preferred embodiment embodying the present invention will now be given referring to the accompanying drawings. Now referring to FIG. 1, which is a schematic block diagram of an exemplary apparatus embodying the preferred embodiment in accordance with the present invention. The apparatus shown is solely an example embodying the preferred embodiment of the present invention. The arrangement of the apparatus shown may illustratively indicate an exemplary preferred embodiment of the apparatus in accordance with the present invention, while the operation of the apparatus may illustratively indicate an exemplary preferred embodiment of the method in accordance with the present invention.

Figure 1:
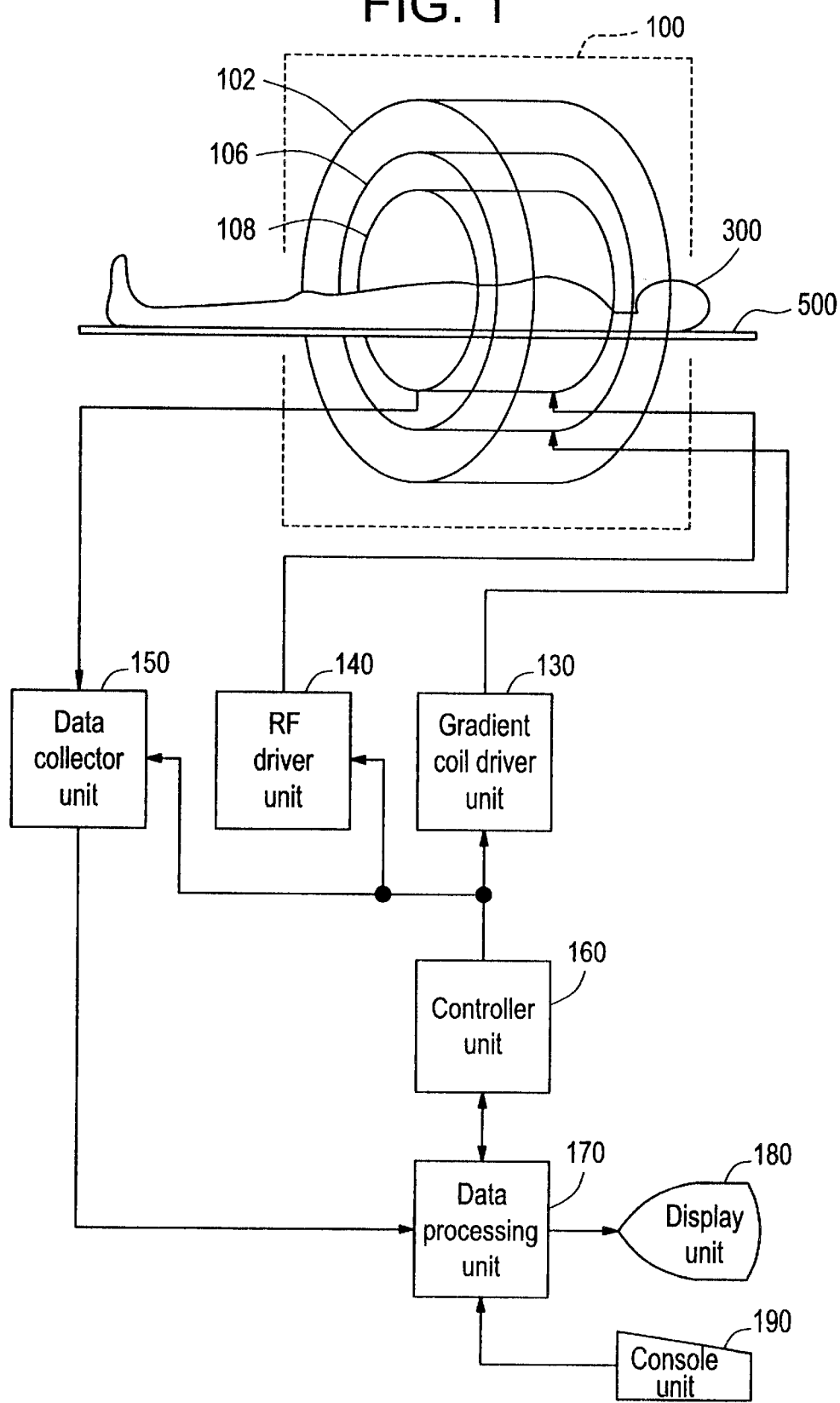
FIG. 1 is a schematic block diagram of an exemplary apparatus embodying the preferred embodiment in accordance with the present invention.

As shown in FIG. 1, the apparatus may include a magnet system 100. The magnet system 100 is comprised of a primary coil unit 102, a gradient coil unit 106, and RF (radio frequency) coil unit 108. These coil units in the magnet system are arranged in a form of approximate cylinder, with coils coaxially placed. The internal space (bore) in a form of approximate cylinder of the magnet system 100 may accept a subject to be imaged 300, carried on a cradle 500, not shown in the figure, carrying in and out the subject to be imaged 300 into and out of the bore.

The primary coil unit 102 will form a static magnetic field in the bore of the magnet system 100. The direction of static magnetic field will be approximately parallel to the body axis of the subject to be imaged 300. The static magnetic field will form, in other words, a so-called horizontal magnetic field. The primary coil unit 102 may be formed by a superconductor coil, for example. It may equally be formed of an ordinary conductivity coil, instead of a superconductor.

The gradient coil unit 106 will generate three gradient magnetic fields in directions each perpendicular to others, namely in a slice axis, phase axis, and frequency axis in order to create a gradient in the intensity of respective static magnetic field.

Assuming that the coordinate axes each perpendicular to others in a static magnetic field space are designated to by x, y, and z, any axis may become the slice axis. Thus, one of remaining two axes will be the phase axis, and the other will be the frequency axis. In addition, it is possible that a given inclination may be included for the x-, y-, z-axes by retaining the perpendicularity among the axes.

The gradient magnetic field in the direction of slice axis is referred to as a slice gradient magnetic field. The gradient magnetic field in the direction of phase axis is referred to as a phase encoding gradient magnetic field. The gradient magnetic field in the direction of frequency axis is referred to as a read out gradient magnetic field. In order to allow these gradient magnetic fields to be generated, the gradient coil unit 106 may include three gradient coils not shown in the figure. In the following description, the gradient magnetic field may also be designated to by a "gradient".

The RF coil unit 108 will generate a high frequency magnetic field for excite spins in the body of subject to be imaged 300 in the static magnetic field space. Generating a high frequency magnetic field may also be designated to by transmission of RF exciter signals. The RF coil unit 108 will receive the electromagnetic radiation caused by the spins excited, i.e., magnetic resonance signals.

The RF coil unit 108 may include a transmitter coil and a receiver coil, not shown in the figure. One single coil may be used for the purpose of both the transmitter coil and receiver coil, or one separated coil independently for transmitting and one for receiving.

The gradient coil unit 106 is connected to a gradient coil driver unit 130. The gradient coil driver unit 130 will apply driving signals to the gradient coil unit 106 to cause the gradient coil unit 106 to generate a gradient magnetic field. The gradient coil driver unit 130 may include three driving circuits not shown in the figure, in correspondence with three gradient coils in the gradient coil unit 106, one for each.

The RF coil unit 108 is connected to an RF driver unit 140. The RF driver unit 140 will apply driving signals to the RF coil unit 108 to cause the RF coil unit 108 to transmit RF excitation signals to excite spins in the body of subject to be imaged 300.

The RF coil unit 108 is also connected to a data collector unit 150. The data collector unit 150 will capture the receiving signals received by the RF coil unit 108 by sampling the signals to collect as digital data.

The gradient coil driver unit 130, RF driver unit 140 and data collector unit 150 are connected to a controller unit 160. The controller unit 160 will control the gradient coil driver unit 130 and data collector unit 150 to execute an imaging sequence.

The controller unit 160 may also control the frequency of output signals from the RF driver unit 140, namely the RF excitation frequency. The controller unit 160 may furthermore control the output signals of the gradient coil driver unit 130. The control of frequency as well as the control of gradient output will be discussed later in greater details.

The controller unit 160 will be formed by for example a computer. The controller unit 160 may have a memory not shown in the figure. The memory will be used for storing the program and various data for the controller unit 160. The functionality of the controller unit 160 will be achieved by the computer executing the program stored in the memory.

The output side of the data collector unit 150 is connected to a data processing unit 170. The data collected by the data collector unit 150 will be input into the data processing unit 170. The data processing unit 170 will be formed by for example a computer. The data processing unit 170 may have a memory not shown in the figure. The memory will be used for storing the program and various data for the data processing unit 170.

The data processing unit 170 is connected to the controller unit 160. The data processing unit 170 is a superior unit to control the controller unit 160. The functionality of the apparatus in accordance with the present invention will be achieved by the data processing unit 170 executing the program stored in the memory.

The assembly comprised of the magnet system 100, the gradient coil driver unit 130, the RF driver unit 140, the data collector unit 150, the controller unit 160 and the data processing unit 170 may illustratively indicate an exemplary apparatus for capturing magnetic resonance signals embodying the preferred embodiment in accordance with the present invention. The arrangement of the apparatus may illustratively indicate an exemplary preferred embodiment of the apparatus in accordance with the present invention, while the operation of the apparatus may illustratively indicate an exemplary preferred embodiment of the method in accordance with the present invention.

The data processing unit 170 will store data collected by the data collector unit 150 into the memory. A data source will be formed in the memory. This data space will form a three dimensional Fourier space, as will be discussed later. The Fourier space will also be referred to as a k-space herein below. The data processing unit 170 will perform a three dimensional inverse Fourier transform on the data in the k-space to reconstruct an image of the subject to be imaged 300.

The data processing unit 170 is connected to a display unit 180 and a console unit 190. The display unit 180 maybe of a graphic display device. The console unit 190 may be of a keyboard together with a pointing device.

The display unit 180 will display a reconstructed image output from the data processing unit 170 and any information thereon. The console unit 190 will be operated by an operator for entering instructions and information input to the data processing unit 170. The operator may perform interactive operation of the apparatus in accordance with the present invention by using the display unit 180 and the console unit 190.

Figure 2:
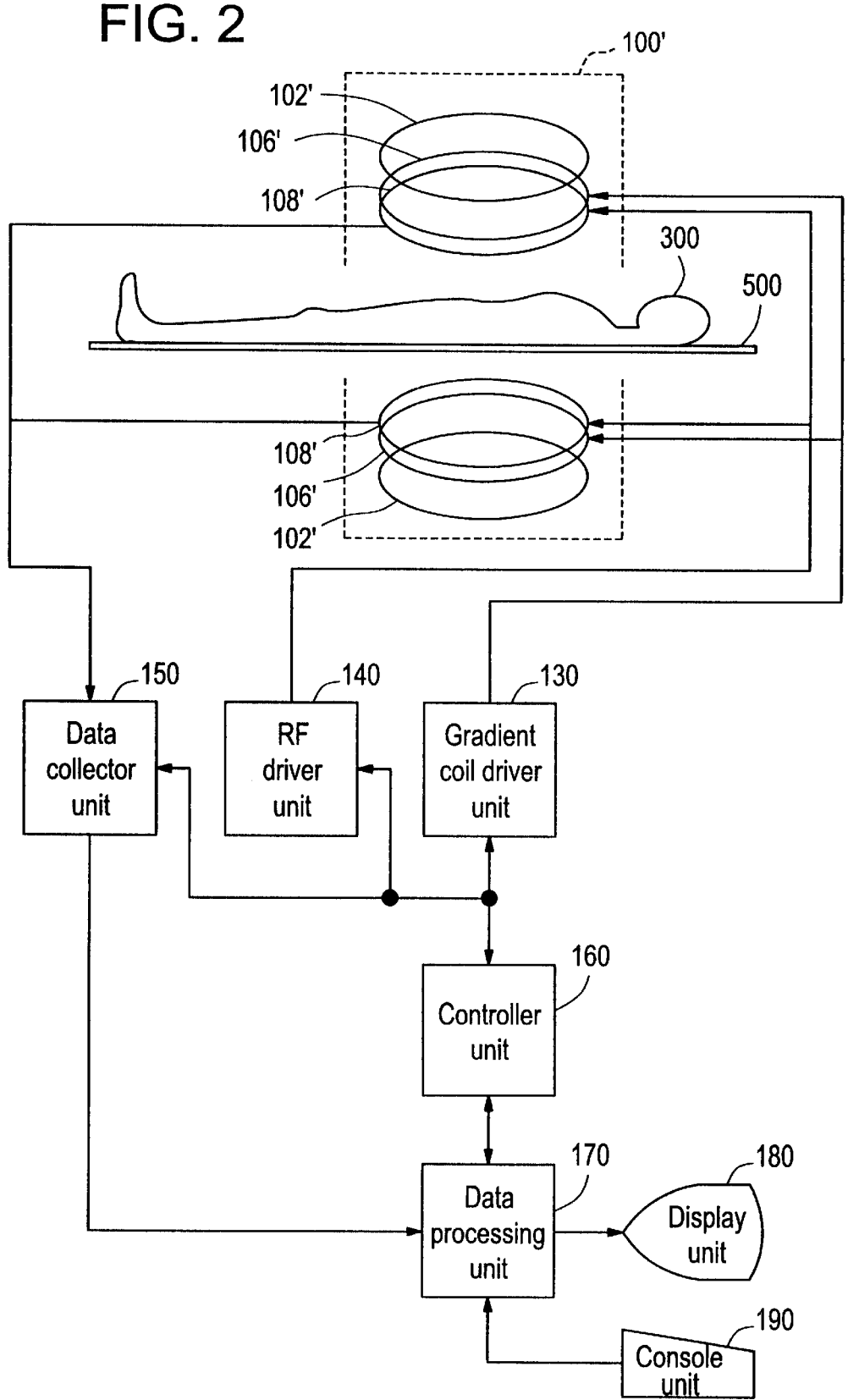
FIG. 2 is a schematic block diagram of another exemplary apparatus embodying the preferred embodiment in accordance with the present invention.

Now referring to FIG. 2, which shows a schematic block diagram of another exemplary apparatus embodying the preferred embodiment in accordance with the present invention. The apparatus may illustratively indicate a typical example of the preferred embodiment in accordance with the present invention. The arrangement of the apparatus may illustratively indicate an exemplary preferred embodiment of the apparatus in accordance with the present invention, while the operation of the apparatus may illustratively indicate an exemplary preferred embodiment of the method in accordance with the present invention.

The apparatus shown in FIG. 2 may have a magnet system 100' of a type different from the apparatus of FIG. 1. The apparatus of FIG. 2 may have identical configuration of other components as that shown in FIG. 1 except for the magnet system 100', and the similar members are designated to the identical reference numbers and the detailed description of the parts already described in the preceding embodiment will be omitted.

The magnet system 100' is comprised of a primary coil unit 102', a gradient coil unit 106', and a RF coil unit 108'. The primary coil unit 102' and other coil units are each made of a pair of units, one piece mating with another opposing thereto in the opposite side of the bore. These units are in the form of approximate discs placed so as to coaxially share the common center axis. The bore (internal space) of the magnet system 100' may house a subject to be imaged 300, carried on a cradle 500, not shown in the figure, carrying in and out the subject to be imaged 300 into and out of the bore.

The primary coil unit 102' will form a static magnetic field in the bore of the magnet system 100'. The direction of static magnetic field will be approximately normal to the body axis of the subject to be imaged 300. In other words, it will form a vertical magnetic field. The primary coil unit 102' may be formed by a permanent magnet, for example. It is needless to say that the primary coil unit 102' may also be equally formed by an ordinary conductive electromagnet, or a superconductor magnet.

The gradient coil unit 106' will generate three gradient magnetic fields in directions each perpendicular to others, namely in a slice axis, phase axis, and frequency axis in order to create a gradient in the intensity of respective static magnetic field.

Assuming that the coordinate axes each perpendicular to others in a static magnetic field space are designated to by x, y, and z, any axis may become the slice axis. Thus, one of remaining two axes will be the phase axis, and the other will be the frequency axis. In addition, it is possible that a given inclination may be included for the x-, y-, z-axes by retaining the perpendicularity among the axes.

The gradient magnetic field in the direction of slice axis is referred to as a slice gradient magnetic field. The gradient magnetic field in the direction of phase axis is referred to as a phase encoding gradient magnetic field. The gradient magnetic field in the direction of frequency axis is referred to as a read out gradient magnetic field. In order to allow these gradient magnetic fields to be generated, the gradient coil unit 106 may include three gradient coils not shown in the figure.

The RF coil unit 108' will send RF excitation signals into the static magnetic field space to excite spins in the body of subject to be imaged 300. The RF coil unit 108' will also receive magnetic resonance signals caused by the spins thus excited.

The RF coil unit 108' may include a transmitter coil and a receiver coil, not shown in the figure. One single coil may be used for the purpose of both the transmitter coil and receiver coil, or one separated coil independently for receiving and one for transmitting.

The assembly composed of the magnet system 100', the gradient coil be driver unit 130, the RF driver unit 140, the data collector unit 150, the controller unit 160, and the data processing unit 170 may illustratively indicate an exemplary apparatus for capturing magnetic resonance signals embodying the preferred embodiment in accordance with the present invention. The arrangement of the apparatus may illustratively indicate an exemplary preferred embodiment of the apparatus in accordance with the present invention, while the operation of the apparatus may illustratively indicate an exemplary preferred embodiment of the method in accordance with the present invention.

Figure 3:
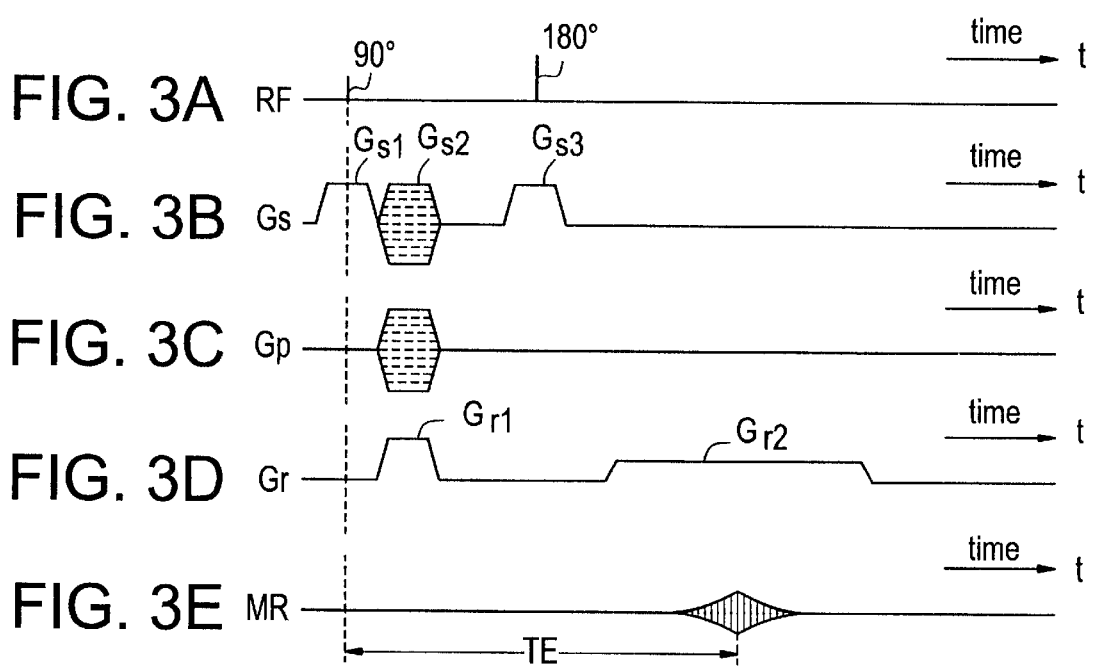
FIG. 3 is a waveform chart of a typical example of pulse sequence to be executed by an apparatus shown in FIG. 1 or FIG. 2.

Now referring to FIG. 3, which shows a typical example of pulse sequences executed by the apparatus of FIG. 1 or FIG. 2 for capturing magnetic resonance signals. The pulse sequence is a pulse sequence for capturing spin echoes caused by three-dimensional scanning.

More specifically, in the figure, (1) is sequence of 90° pulses and 180° pulses for RF excitation. (2), (3), (4), and (5) are sequences for slice gradient Gs, phase encoding gradient Gp, read out gradient Gr, and spin echo MR, respectively. The 90° pulses and 180° pulses will be represented by their center values. The pulse sequences will go from left to right, along with the time axis t.

As shown in the figure, the 90° excitation and 180° excitation will be done by 90° pulses and 180° pulses, respectively. At the time of the 90° excitation and 180° excitation slice gradients Gs1 and Gs3 will be applied respectively to selectively excite a desired slab.

During a period between a 90° excitation and a 180° excitation, a phase encoding in the direction of slice axis will be performed by means of a slice gradient Gs2. In the same period the phase encoding in the direction of phase axis by means of a phase encode gradient Gp and the dephase in the direction of frequency axis by means of a read out gradient Gr1 will be performed.

After a 180° excitation, a rephase by a read out gradient Gr2 may cause spin echo MR to be generated. The spin echo MR Will be RF signals having symmetric wave shapes with respect to the echo center. The echo center will be generated TE (echo time) after the 90° excitation. The spin echo MR will be collected by the data collector unit 150 as view data.

The pulse sequences as described above will be iteratively repeated for 64 to 256 times, for example, at a cycle TR (repetition time) with sequentially varying slice gradient Gs2. In the figure the short dashes line is illustratively and imaginarily indicative of sequential changes in the slice gradient Gs2. Along with such a repetition, a same phase encoding gradient Gp in the direction of phase axis will be applied for each time. This may yield view data of 64 to 256 views in the k-space, with same phase encoding in the direction of phase axis, and with different phase encoding in the direction of slice axis.

The pulse sequences as described above will be iteratively repeated for 64 to 256 times. For each repetition, the phase encode gradient Gp in the direction of phase axis will be changed. The short dashes line illustratively and imaginarily indicates sequential changes in the slice gradient Gp. This may yield a set of view data of 64 to 256 views with a phase encode different in the direction of phase axis. The data set will be composed of data of 64 to 256 views, each different phase encode in the direction of slice axis. The view data thus obtained will be gathered into the memory in the data processing unit 170.

Figure 4:
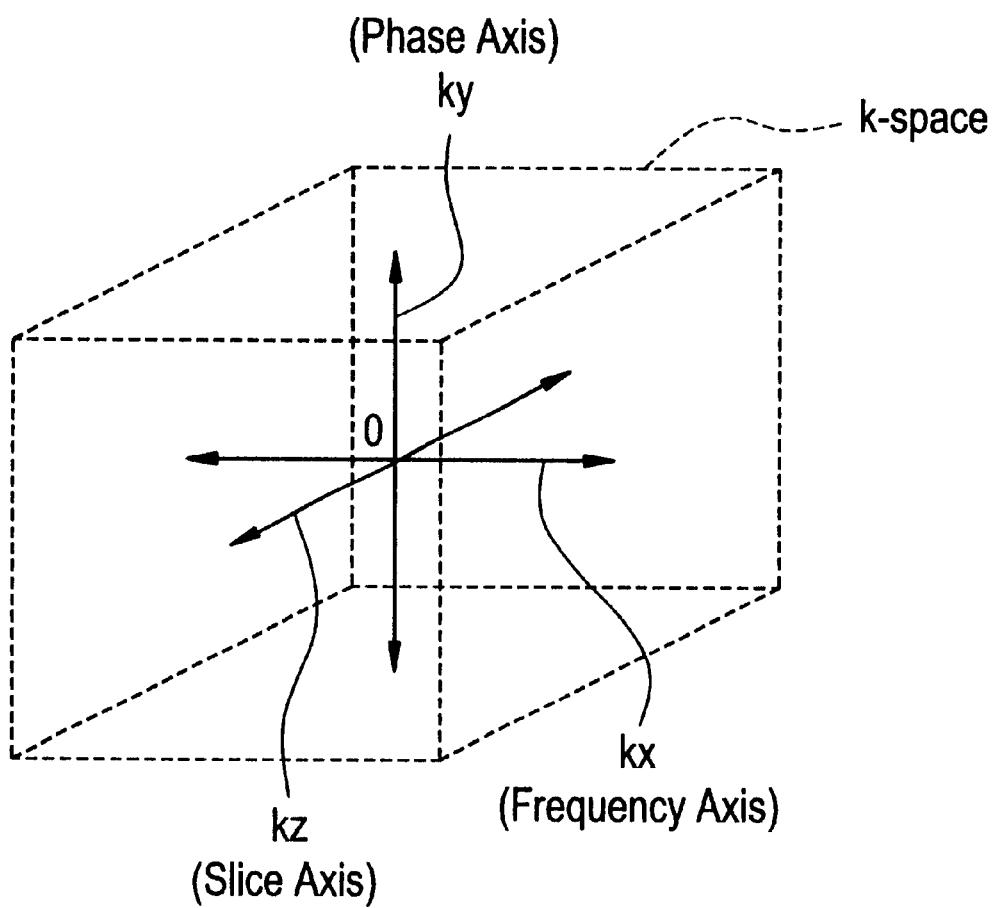
FIG. 4 is a conceptual representation of a three dimensional Fourier space.

Now referring to FIG. 4, there is shown a conceptual representation of a k-space, built in the memory. As shown in the figure, k-space is a three-dimensional Fourier space having three coordinate axes kx, ky, and kz each perpendicular to others.

The kx may correspond to a frequency axis. The ky may correspond to a phase axis. The kz may correspond to a slice axis. The view data of different phase encoding in the direction of phase axis may have different position on the ky axis. The view data of different phase encoding in the direction of slice axis may have different position on the kz axis. Three-dimensional inverse Fourier transform of such data in the k-space may obtain a three dimensional image data in a real space, namely the reconstructed image.

The change in the position of the slab excitation and the compensation therefor when there is an error in the slice gradient Gs, together with the phase encoding compensation in the direction of slice axis will be described in greater details herein below. Now referring to FIG. 5, there are shown (a) slab profile in the slice axis and (b) slab profile in the spin phase. For the sake of description, z-axis is assumed to be the slice axis.

As shown by the solid line in (a), assuming that a slab having center at a distance z1 with a thickness S will be RF excited to be imaged. The RF excitation will be performed by 90° pulses. The RF excitation will be simply referred to as the excitation, herein below.

In correspondence with the excitation, as shown by the solid line in (b), phase encoding will be performed such that the phase of spins in the slab of thickness S will distribute in a linear manner along with the z axis from $-\pi$ to $+\pi$. The phase encoding will be done according to the phase encode gradient Gs2. The phase encoding shown is the maximum phase encoding in the (+) direction.

Figure 6:
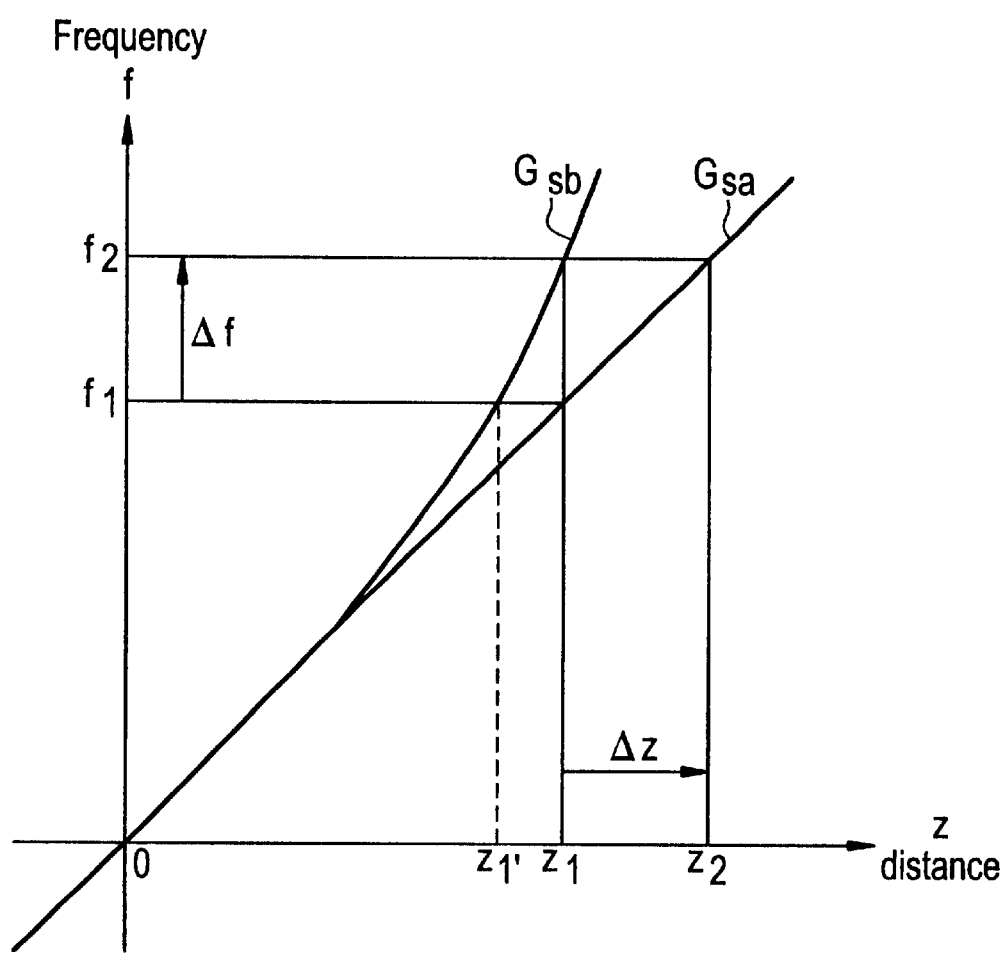
FIG. 6 is a graph indicative of characteristics of a gradient magnetic field.

The slice gradient Gs should be ideally a gradient in proportion to the distance z, as shown by the straight line Gsa in FIG. 6. However, in practice, the gradient may have an error with respect to the ideal gradient, as shown by the curved line Gsb. The intensity of gradient magnetic field in FIG. 6 is represented by converting into the spin frequency. The slice gradient will be simply referred to as the gradient, herein below.

In such a context, if the excitation is performed at a frequency f1, which may be determined by the ideal gradient Gsa, in order to excite the slab having its center at the distance z1, there will be an error of slab position in practice, because another slab having its center at a distance z1' determined by an erroneous gradient Gsb.

Thus a frequency f2 corresponding to the distance z1 based on the real and previously known gradient Gsb will be determined to excite at that frequency f2. This may correspond to the excitation of the slab having its center at a distance z2 when the gradient is ideal. By shifting the frequency by $\Delta f$ from f1 to f2, the center position of slab will be displaced by $\Delta z$ from z1 to z2. The $\Delta z$ will be proportional to $\Delta f$.

Such an RF excitation will be performed by the RF driver unit 140 and the RF coil unit 108 (108') under the control of the controller unit 160 controlled by the data processing unit 170. The assembly composed of the data processing unit 170, controller unit 160, the RF driver unit 140 and the RF coil unit 108 (108') represents a typical example embodying the preferred embodiment of selective exciting means in accordance with the present invention.

Figure 5A:
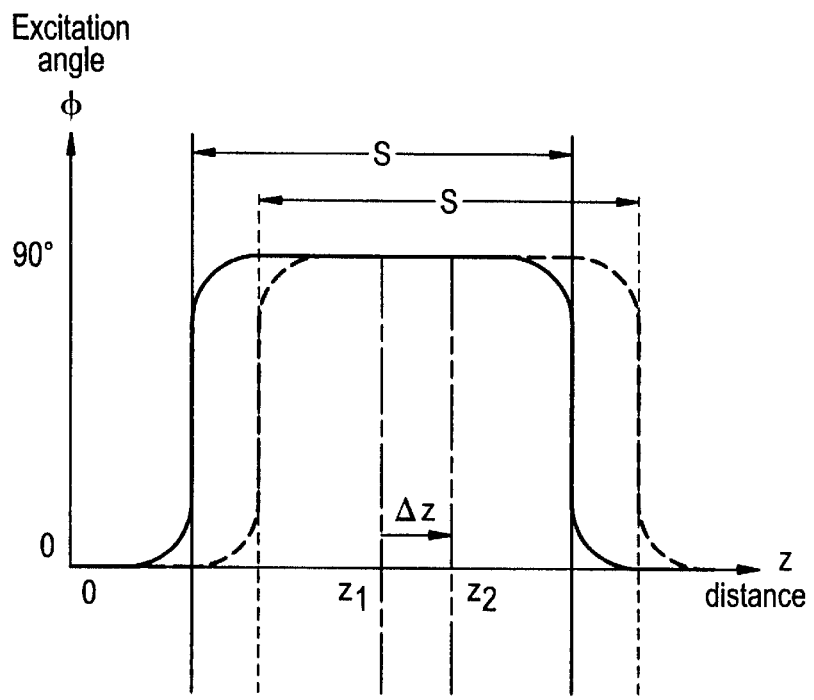
FIG. 5 is a graphical schematic diagram of a slab profile and a phase profile.
Figure 5B:
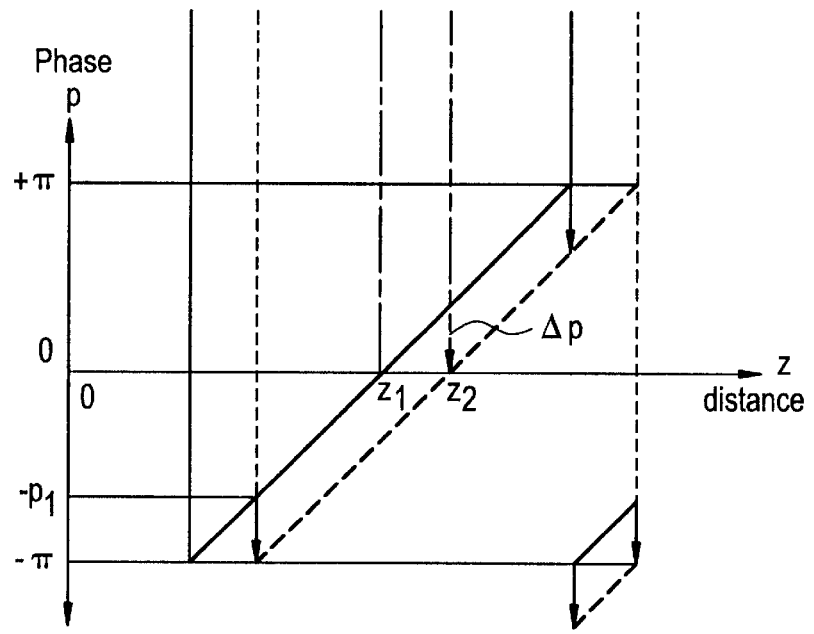

The apparent profile of the slab with such an excitation will be that shown by the short dashes line in FIG. 5 (a), with its center displaced to the position at the distance z2 by $\Delta z$. With respect to the slab having its center apparently displaced, the profile of spin phase will vary linearly from $-p1$ to $+\pi$ as shown in (b), then will be folded from $-\pi$ side to vary linearly up to $-p1$. This folded profile of spin phase may cause a folding in the reconstruction image. The profile of spin phase will be simply referred to as phase profile, herein below.

In order to avoid such phenomenon, it will need only to vary the phase profile without folding from $-\pi$ to $+\pi$, with respect to the apparent slab, as shown by the short dashes line in the figure. This can be implemented by a parallel translation of the phase profile shown by the solid line by $\Delta p$.

The amount of parallel translation $\Delta p$ of the phase profile may be given by the following equation:

$$\Delta p = -\frac{\Delta z}{S} \cdot 2\pi \quad (1)$$

where:

Δz: apparent positional displacement of slab (in proportion to the frequency shift Δf)

S: thickness of slab

The parallel translation of the phase profile as shown above can be implemented by adjusting the gradient Gs2 such that the amount of the maximum phase encoding in the (+) direction becomes:

$$\pi + \Delta p = \left(1 - 2\frac{\Delta z}{S}\right)\pi \quad (2)$$

In general, the amount of parallel translation Δp when the amount of phase encoding is P may be given by the following equation:

$$\Delta p = -\frac{\Delta z}{S} \cdot 2P \quad (3)$$

Such parallel translation of the phase profile can be implemented by adjusting the gradient Gs2 such that the amount of the phase encoding becomes:

$$P + \Delta p = \left(1 - 2\frac{\Delta z}{S}\right)P \quad (4)$$

The phase encode as shown above will be performed by the gradient coil driver unit 130 and the gradient coil unit 106 (106') under the control of the controller unit 160 controlled by the data processing unit 170. The assembly composed of the data processing unit 170, the controller unit 160, the gradient coil driver unit 130 and the gradient coil unit 106 (106') represents a typical example of the preferred embodiment of a phase encoding means in accordance with the present invention.

The RF excitation of slab as have been described above together with the corresponding phase encoding in the direction of slice axis may allow obtaining view data without causing folding in the direction of slice axis in the reconstructed image.

A program to execute the functionality of capturing magnetic resonance signals on a computer as have been described above may be stored in a computer-readable recording medium. Any recording medium including such as magnetic recording mediums, optical recording mediums, opto-magnetic recording mediums and the like may be used appropriately. The recording medium may also be a semiconductor storage device. In this specification, the storage device is a synonym of recording medium.

Many widely different embodiments of the invention may be configured without departing from the spirit and the scope of the present invention. It should be understood that the present invention is not limited to the specific embodiments described in the specification, except as defined in the appended claims.

What is claimed is:

1. A method of capturing magnetic resonance signals, said method comprising the steps of:

using a three dimensional scanning by selectively exciting a slab with a gradient magnetic field and RF signals applied in a slice axis, said RF signals having a frequency compensated for in response to an error of said gradient magnetic field; and phase encoding in said slice axis in a compensated phase corresponding to said frequency compensation; wherein said compensated phase is given by the following:

$$P' = \left(1 - 2\frac{\Delta z}{S}\right)P$$

wherein: P' is the phase after compensation; Δz is the apparent positional displacement of slab caused by frequency compensation; S is the slab thickness; and P is the phase before compensation.

2. The method of claim 1, wherein said frequency is controlled by a computer executing a program stored in a memory thereof.

3. The method of claim 1, wherein said error in gradient magnetic field is obtained by comparing an ideal gradient with an actual gradient.

4. The method of claim 3, wherein said gradient magnetic field error is converted into spin frequency error.

5. The method of claim 4, wherein the phase error is obtained from spin frequency error.

6. An apparatus for capturing magnetic resonance signals, said apparatus comprising:

means for using a three dimensional scanning by selectively exciting a slab with a gradient magnetic field and RF signals applied in a slice axis, said RF signals having a frequency compensated for in response to an error of said gradient magnetic field; and means for phase encoding in said slice axis in a compensated phase corresponding to said frequency compensation; wherein said compensated phase it given by the following:

$$P' = \left(1 - 2\frac{\Delta z}{S}\right)P$$

wherein: P' is the phase after compensation; Δz to the apparent positional displacement of slab caused by frequency compensation; S is the slab thickness; and P is the phase before compensation.

7. The apparatus of claim 6, wherein said frequency is controlled by computer means executing a program stored in a memory thereof.

8. The apparatus of claim 6, wherein said error in gradient magnetic field is obtained by means for comparing an ideal gradient with an actual gradient.

9. The apparatus of claim 8, wherein said gradient magnetic field error is converted into spin frequency error.

10. The method of claim 9, wherein the phase error is obtained from spin frequency error.

11. A computer-readable recording medium for storing a program to be executed on a computer, said program comprising the steps of:

using a three dimensional scanning by selectively exciting a slab with a gradient magnetic field and RF signals applied in a slice axis, said RF signals having a frequency compensated for in response to an error of said gradient magnetic field; and phase encoding in said slice axis in a compensated phase corresponding to said frequency compensation; wherein said compensated phase is given by the following:

$$P' = \left(1 - 2\frac{\Delta z}{S}\right)P$$

wherein: P' to the phase after compensation; Δz is the apparent positional displacement of slab caused by frequency compensation; S to the slab thickness; and P is the phase before compensation.

12. The medium of claim 11, wherein said error in gradient magnetic field to obtained by comparing an ideal gradient with an actual gradient.

13. The medium of claim 12, wherein said gradient magnetic field error is converted into spin frequency error.

14. The medium of claim 13, wherein said phase error is obtained from spin frequency error.

15. A magnetic resonance imaging system for capturing magnetic resonance imaging signals, said system comprising:

means for using a three dimensional scanning by selectively exciting a slab with a gradient magnetic field and RF signals applied in a slice axis, said RF signals having a frequency compensated for in response to an error of said gradient magnetic field; and means for phase encoding in said slice axis in a compensated phase corresponding to said frequency compensations; wherein said compensated phase is given by the following:

$$P' = \left(1 - 2\frac{\Delta z}{S}\right)P$$

wherein: P' is the phase after compensation; Δz is the apparent positional displacement of slab caused by frequency compensation; S is the slab thickness; and P is the phase before compensation.

16. The system of claim 15, wherein said frequency is controlled by computer means executing a program stored in a memory thereof.

17. The system of claim 15, wherein said error in gradient magnetic field is obtained by means for comparing an ideal gradient with an actual gradient.

18. The system of claim 17, wherein said gradient magnetic field error is converted into spin frequency error.

19. The system of claim 18, wherein the phase error is obtained from said spin frequency error.

* * * * *